United States Patent
Erbert et al.

(10) Patent No.: US 6,961,358 B2
(45) Date of Patent: Nov. 1, 2005

(54) SEMICONDUCTOR LASER

(75) Inventors: Götz Erbert, Berlin (DE); Günther Tränkle, Berlin (DE); Hans Wenzel, Berlin (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 161 days.

(21) Appl. No.: 10/381,177

(22) PCT Filed: Sep. 20, 2001

(86) PCT No.: PCT/DE01/03649

§ 371 (c)(1),
(2), (4) Date: Mar. 20, 2003

(87) PCT Pub. No.: WO02/25787

PCT Pub. Date: Mar. 28, 2002

(65) Prior Publication Data

US 2004/0047378 A1 Mar. 11, 2004

(30) Foreign Application Priority Data

Sep. 20, 2000 (DE) .......... 100 46 580

(51) Int. Cl.⁷ .............. H01S 5/00
(52) U.S. Cl. .......... 372/45; 372/92; 372/50; 372/26
(58) Field of Search ............ 372/43–50, 92, 372/26

(56) References Cited

U.S. PATENT DOCUMENTS

| | | | |
|---|---|---|---|
| 4,715,672 A | | 12/1987 | Duguay et al. |
| 5,260,959 A | | 11/1993 | Hayakawa |
| 5,272,711 A | * | 12/1993 | Mawst et al. .......... 372/45 |
| 5,289,484 A | | 2/1994 | Hayakawa |
| 5,528,616 A | * | 6/1996 | Kash et al. .......... 372/45 |
| 5,606,570 A | | 2/1997 | Botez et al. |
| 5,815,521 A | | 9/1998 | Hobson et al. |
| 5,818,860 A | | 10/1998 | Garbuzov |
| 6,031,243 A | * | 2/2000 | Taylor .......... 257/13 |
| 6,396,865 B1 | * | 5/2002 | Mawst et al. .......... 372/96 |
| 6,717,970 B2 | * | 4/2004 | Marsh et al. .......... 372/50 |

FOREIGN PATENT DOCUMENTS

| | | |
|---|---|---|
| JP | 61 156 788 | 12/1986 |
| WO | WO 96/08062 | 3/1996 |

OTHER PUBLICATIONS

M. Buda, et al., "Low–Loss Low–Confinement GaAs–AlGaAs DQW Laser Diode with Optical Trap Layer for High–Power Operation", IEEE Phototonics Technology Letters, vol. 11, No. 2, Feb. 1999, pp. 161–163.

D. Botez, "Design Considerations and Analytical Approximations for High Continuous–Wave Power, Broad–Waveguides Diode Lasers", Applied Physics Letters, vol. 74, No. 21, May 1999, pp. 3102–3104.

T.L. Koch, "Spectral dependence of propagation loss in InP/InGaAsP antiresonant reflecting optical waveguides grown by chemical beam epitaxy" Applied Physics Letter, vol. 50, No. 6, Feb. 1987, pp. 307–309.

(Continued)

*Primary Examiner*—Minsun Oh Harvey
*Assistant Examiner*—Delma R. Flores-Ruiz
(74) *Attorney, Agent, or Firm*—Cohen, Pontani, Lieberman & Pavane

(57) ABSTRACT

A semiconductor laser has an antiresonant waveguide (10), which is formed by a layer sequence applied to a substrate (1). The layer sequence has outer waveguide regions (2, 8), reflection layers (3, 7), and a waveguide core (11) with an active layer (5). With this structure, semiconductor lasers with only slight vertical beam divergence and with a large beam cross section can be produced.

25 Claims, 4 Drawing Sheets

OTHER PUBLICATIONS

Jeon H., et al. "High–Power Low–Divergence Semiconductor Lasers for GaAs–Based 980–nm and InP–Based 1550–nm Applications", IEEE Journal of Selected Topics in Quantum Electronics, vol. 3, No. 6, 1997, pp. 1344–1350.

C. Zmudzinski, et al., "Three–Core ARROW–Type Diode Laser: Novel High–Power, Single–Mode Device, and Effective Master Oscillator for Flared Antiguided MOPA's", IEEE Journal of Selected Topics in Quantum Electronics, vol. 1, No. 2, Jun. 1995, pp. 129–137.

Smowton P M et al., "650–NM Lasers with Narrow Far–Field Divergence with Integrated Optical Mode Expansion Layers" IEEE Journal of Selected Topics in Quantum Electronics, IEEE Service Ctr., US Bd. 5, Nr. 3, pp. 735–739 May 1999.

Shun Tung Yen et al., "Theoretical Investigation on Semiconductor Lasers with Passive Waveguides", IEEE Journal of Quantum Electronics, IEEE Inc., NY, US Bd. 32, Nr. 1, pp. 4–13, 1996.

Li W L et al., "Design of AlGaInP Visible Lasers with a Low Vertical Divergence Angle", Solid State Electronics, Elsevier Science Publishers, Barking, GB, Bd. 42, Nr. 1, 1998, pp. 87–90.

Mawst L J et al., "Design Optimization of Arrow–Type Diode Lasers", IEEE Photonics Technology Letters, IEEE Inc., New York US, Bd. 4, Nr. 11, Nov., 1992, pp 1204–1206.

Wenzel et al., Higher–Power Diode Lasers with Small Vertical Beam Divergence Emitting at 808 nm, Electronics Letters, Bd. 37, Nr. 16, Aug., 2001, pp. 1024–1026.

* cited by examiner

SEMICONDUCTOR LASER

The invention relates to a semiconductor laser with reduced vertical beam divergence.

Semiconductor lasers with high optical output power are used for numerous applications. Such applications include optical communications, cancer treatment in medicine, optical pumps of solid-state lasers, and direct material machining. For such applications, semiconductor lasers are especially suitable, because of their small size, high efficiency, the possibility of being electrically triggered, and the possibility of being produced economically in large numbers.

In particular, semiconductor lasers with the emission wavelength of 808 nm serve to pump Nd:YAG solid-state lasers.

Semiconductor lasers are in general semiconductor components, in which at least one active layer and two inner and two outer boundary layers each are deposited on a substrate. The active layer is disposed between the two inner boundary layers. Typically, the layers are deposited using liquid phase epitaxy (LPE), metal organic chemical vapor deposition(MOCVD), or molecular beam epitaxy (MBE). The boundary layers are of opposite conduction types, so that when a suitable electrical voltage is applied, holes from the p-conducting boundary layers and electrons from the n-conducting boundary layers are injected into the active layer, where they recombine. The end faces or crystal facets of the semiconductor laser form a resonator. Above a certain electrical current, the so-called threshold current, stimulated emission occurs, and a virtually monochromatic focused beam of light is generated, which emerges from a crystal facet that is kept semipermeable.

The outer boundary layers typically have a lower index of refraction than the inner boundary layers and the active layer, so that an optical waveguide is formed in which the inner boundary layers together with the active layer form the waveguide core. By means of how the light is guided in the waveguide core, the greatest possible overlap of the light field with the active layer is to be achieved. Typically, the waveguide is constructed such that only the so-called fundamental mode, but not any higher modes, are carried in the waveguide core. In this context, the fundamental mode is understood to be the mode whose sole maximum intensity is located in the active layer. Higher modes are distinguished by having a plurality of maximum intensities.

Among other things, the optical output power of semiconductor lasers is limited by the thermally caused degradation of the crystal facets serving as a resonator mirror. To attain the highest possible optical output power, the thermal load on the crystal facets of the semiconductor laser must accordingly be kept as low as possible. It is therefore important to keep the beam cross section at the crystal facets as large as possible.

From U.S. Pat. No. 5,272,711, it is known to provide an antiresonantly reflective waveguide above the active layer. The antiresonantly reflective waveguide has a waveguide core, laterally bounded by reflection layers, and outer waveguide regions adjoin the reflection layers. Viewed in cross section, the waveguide core, reflection layers and outer waveguide regions are in one layer next to one another. The waveguide core and the outer waveguide regions each have lower indexes of refraction than the reflection layers. The width of the reflection layers is equal to an odd-numbered multiple of one-quarter of the wavelength of the light projected on the cross section. The width of the outer waveguide regions is equal to an odd-numbered multiple of half the width of the waveguide core. In the antiresonantly reflective waveguide, the fundamental mode has high amplitudes only in the waveguide core, while higher-order modes have high amplitudes in the outer waveguide regions as well. As a result, the higher-order modes are effectively damped. With such an arrangement, semiconductor lasers with a waveguide core with a width of between 4 and 8 µm can be created. The divergence of the laser beam generated with the known semiconductor laser is in the range of 4° to 8° in the lateral direction.

Fundamentally similar arrangements are described in C. Zmudzinski et al, IEEE Journal of Selected Topics in Quantum Electronics, Vol. 1, No. 2, June 1995, 129–137, and in T. L. Koch et al, Applied Physics Letters 50 (6), 9 Feb. 1987, 307–309.

One disadvantage of the known semiconductor laser is that the divergence in the vertical direction is still very high, being 30° to 40°. Here the vertical direction is understood to be the direction of growth of the epitaxially applied layers. Because of the high width of half-maximum of 30° to 40°, even very complicated optical devices can utilize only 80% to 90% of the light emitted by the semiconductor laser.

From the article by D. Botez, "Design considerations and analytical approximations for high continuous-wave power, broad-waveguide diode laser", Applied Physics Letters, Vol. 74, pages 3102–3104, 1999, it is known that the beam divergence can be reduced by widening the waveguide core and by reducing the difference between the indexes of refraction of the waveguide core and the adjacent reflection layers. Widening the waveguide core, however, means that not only the fundamental modes but higher modes as well are guided through the waveguide core and under some circumstances can reach the laser threshold. This is associated with a drastic worsening in the quantity of the laser beam. In practice, the thickness of the waveguide core is therefore limited to values of <2 µm. This is equivalent to a beam divergence in the vertical direction of more than 30° width of half-maximum. Reducing the difference in the index of refraction between the waveguide core and the reflection layers is also feasible only with difficulty in practice. To achieve a beam divergence with a width of half-maximum of <20°, very great technological effort and expense are required to establish the very slight difference in indexes of refraction.

Other attempts at reducing the beam divergence of a semiconductor laser have been described in U.S. Pat. Nos. 5,289,484 and 5,815,521 and by Heonsu Jeon et al, IEEE Journal of Selected Topics in Quantum Electronics, VO. 3, No. 6, December 1997, 1344–1350.

SUMMARY OF THE INVENTION

One object of the invention is to provide a single-mode semiconductor laser that is simple to produce and has only slight vertical beam divergence.

This and other objects are attained in accordance with one aspect of the invention directed to a semiconductor laser, in which on a substrate, a layer sequence is applied, in which in succession, viewed from the substrate, a first outer waveguide layer (2), a first reflection layer (3), a waveguide core (11), in which a photo-emitting active layer (5) is embodied, a second reflection layer (7), and a second outer waveguide layer (8) are disposed. The first and second reflection layers (3, 7) have indexes of refraction which are greater than the indexes of refraction of the waveguide core (11) and of the respective adjacent outer waveguide layer (2, 8). The layer sequence in the vertical direction has an antiresonantly reflective waveguide (10).

To further increase the optical output power and to improve the beam quality, in the semiconductor laser of the invention the layer sequence is selected such that an antiresonantly reflective waveguide is formed in the vertical direction. The waveguide core, the reflection layers, and the outer waveguide regions are each formed, according to the invention, by layers. As a result, the waveguide core can have a thickness of more than 2 μm. As a result, the vertical beam divergence can be reduced substantially. In particular, a waveguide core with a thickness of 3 μm, in the wavelength range around 800 nm, has a vertical beam divergence of approximately 18° full width at half-maximum.

Moreover, because of the large thickness of the waveguide core, the optical power is distributed over a larger cross section, so that the thermal load on the crystal facets drops, and a higher optical output power can be achieved.

In the semiconductor laser of the invention, the differences in indexes of refraction between the individual layers are so great that wide variations in production are tolerable. Moreover, because the waveguide core has a lower index of refraction, or in other words as a rule comprises a semiconductor material with a greater energy gap, a better confinement of the charge carriers is achieved, and the absorption from heating at the crystal facets is reduced.

Preferably, the active layer has two so-called spacer layers, between which an active quantum well is disposed. The spacer layers lead to an improvement of the boundary faces of the quantum well and thus an improvement in the laser properties.

Especially preferably, the reflection layers of the arrangements of the invention are highly doped (for instance, $2 \times 10^{18}$ cm$^{-3}$). This provision already by itself is based on an inventive step, which regardless of the other structural provisions on its own already leads to improved power data.

To reduce the bulk resistance, the heterojunctions of the above structures of the inventions can be graded.

BRIEF DESCRIPTION OF THE DRAWINGS

Other advantages and advantageous embodiments will become apparent from the exemplary embodiments described below in conjunction with the drawings. Shown are.

DETAILED DESCRIPTION OF THE DRAWINGS

Figure 1:
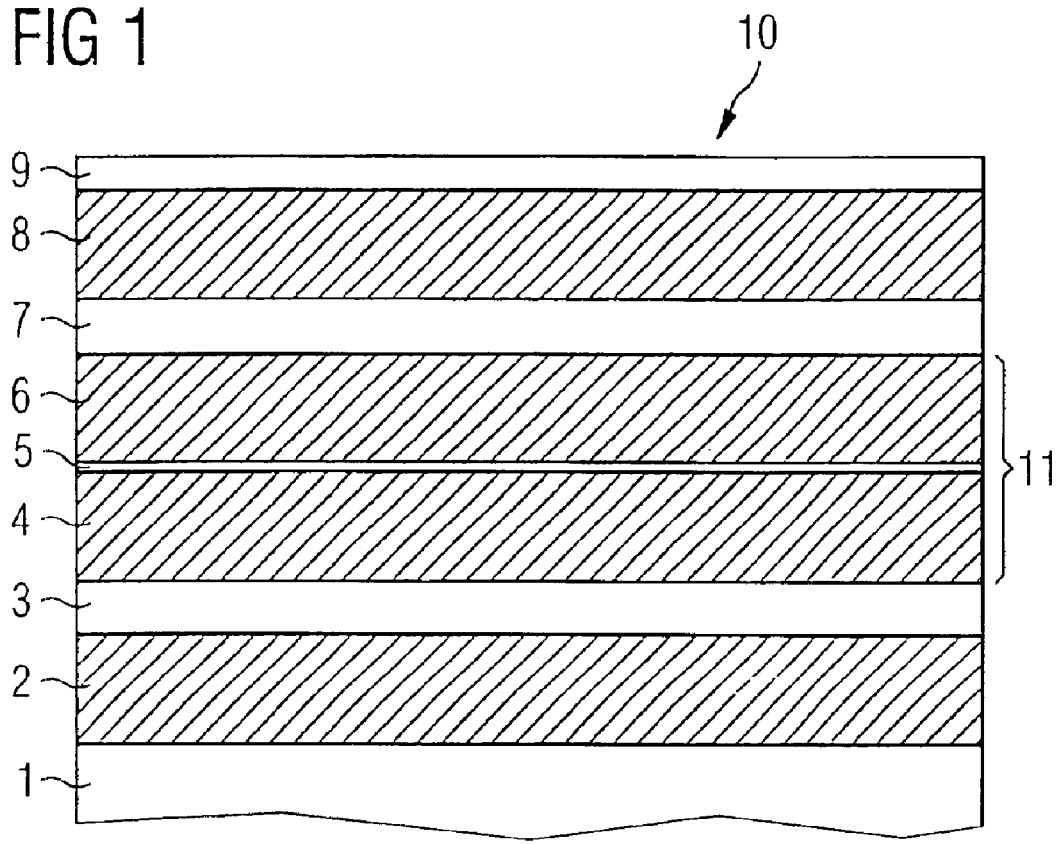
FIG. 1, a schematic illustration of a cross section through a layer sequence of a semiconductor laser according to the invention.

In the descriptions of the various exemplary embodiments, components that are the same or work similarly are each identified by the same reference numerals.

FIG. 1 shows a cross section through a semiconductor laser, which has a substrate 1 of monocrystalline semiconductor material with an index of refraction $n_1$. Located on the substrate 1 is a first outer waveguide layer 2 with an index of refraction $n_2$ and of thickness $d_2$. The outer waveguide layer 2 is followed by a first reflection layer 3 with an index of refraction $n_3$ and of thickness $d_3$. This is followed by an inner waveguide layer 4 with an index of refraction $n_4$ and of thickness $d_4$; a photo-emitting active layer 5 with the index of refraction $n_5$ and the thickness $d_5$; and a second inner waveguide layer 6. These are followed by a second reflection layer 7 with the index of refraction $n_7$ and the thickness $d_7$; a second outer waveguide layer 8 with the index of refraction $n_8$ and the thickness $d_8$; and a contact layer 9 with the index of refraction $n_9$. Together, the layers form an antiresonant waveguide 10, in whose waveguide core 11, formed by the inner waveguide layers 4 and 6, the active layer 5 is embedded.

Figure 2:
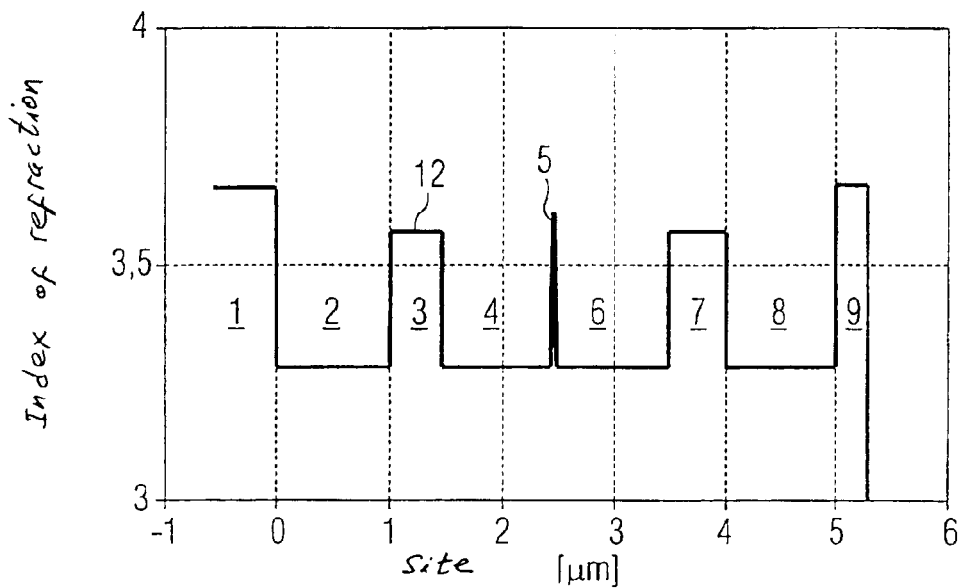
FIG. 2, a schematic illustration of a graph that shows the course of the index of refraction through the layer sequence.

In FIG. 2, one possible course of an index of refraction profile 12 is shown. In practice, the transition from one such level to another certainly need not be abrupt but instead can have a ramplike, continuous course. What is essential for the function of the antiresonantly reflective waveguide is that the indexes of refraction $n_3$ and $n_7$ of the reflection layers 3 and 7 are greater than the indexes of refraction $n_2$ and $n_8$ of the outer waveguide layers 2 and 8 and are also greater than the indexes of refraction $n_4$ and $n_6$ of the inner waveguide layers 4 and 6. The indexes of refraction of the outer boundary layers 2 and 8, the reflection layers 3 and 7, and the inner waveguide layers 4 and 6 can each be equal. The same can also be true of the various layer thicknesses, so that the result is a virtually symmetrical layer sequence relative to the active layer 5.

The indexes of refraction $n_2$ and $n_4$ of the first outer and inner waveguide layer 2 and 4 and the indexes of refraction $n_6$ and $n_8$ of the two inner and outer waveguide layers 6 and 8 can also be virtually equal.

The thickness of the reflection layers 3 and 7 is selected such that it makes up approximately an odd-numbered multiple of one-quarter of the wavelength of the fundamental mode projected in the vertical direction. If the reflection layers are each understood as a Fabry-Perot cavity, then this is equivalent to an antiresonance of the cavity. In general, the thicknesses $d_3$ and $d_7$ of the middle boundary layers 3 and 7 must be selected such that the radiation losses of the fundamental mode become minimal; moreover, the maximum optical intensity of the fundamental mode should extend along the active layer 5.

The thicknesses $d_2$ and $d_8$ of the outer waveguide layers 2 and 8 are expediently selected such that the radiation losses of the fundamental mode do not exceed a certain value. Preferably, the thicknesses $d_2$ and $d_8$ of the outer waveguide layers 2 and 8 amount to an odd-numbered multiple of half the thickness of the waveguide core 11.

As a result of the choice of the layer thickness of the reflection layers 3 and 7, the fundamental mode is reflected antiresonantly at the reflection layers. The higher-order modes, conversely, are reflected resonantly, so that they suffer substantially greater radiation losses and consequently do not reach the laser threshold. If an optimal choice of the thickness of the reflection layers 3 and 7 is made, the radiation losses of the fundamental mode can be reduced to <1/cm, while the radiation losses of the higher-order modes amount to more than 100/cm. Thus these modes cannot reach the laser threshold.

A concrete exemplary embodiment of the semiconductor laser will now be presented in conjunction with FIG. 2. The following figures given for the indexes of refraction refer to a wavelength of 808 nm.

In the exemplary embodiment, the substrate 1 comprises n-conductive GaAs with an index of refraction of $n_1=3.67$. The outer waveguide layers 2 and 8 are of n-conducting $Al_{0.5}Ga_{0.5}As$ of thickness $d_2=d_8=1$ μm, with an index of refraction of $n_2=n_8=3.29$. The reflection layers 3 and 7 comprise n-conducting $Al_{0.15}Ga_{0.85}As$ of thickness $d_3=d_7=0.5$ μm, with an index of refraction of $n_3=n_7=3.57$. The inner waveguide layers 4 and 6 comprise n-conducting $Al_{0.5}Ga_{0.5}As$ of thickness $d_4=d_6=1$ μm, with an index of refraction of $n_4=n_6=3.29$. For the undoped active layer 5, which is 17 nm thick, finally, $GaAs_{0.8}P_{0.2}$ with an index of refraction of $n_5=3.61$ is used.

Figure 3:
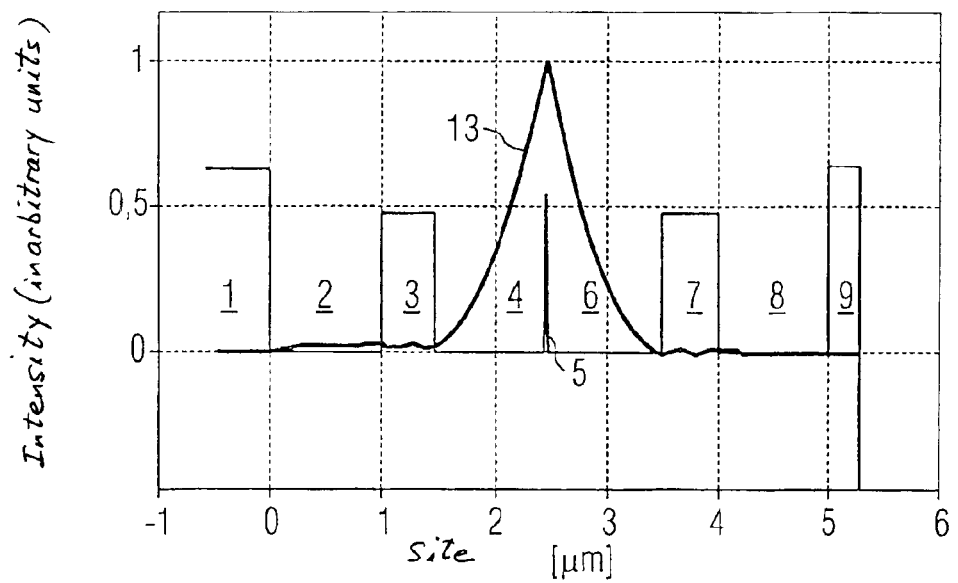
FIG. 3, a schematic illustration of a graph showing the course of the optical intensity of the fundamental mode, superimposed on the course of the index of refraction.

FIG. 3 shows the course calculated for the optical intensity of the fundamental mode 13, superimposed on the course of the index of refraction profile 12. The index of refraction profile 12 shown in FIG. 2 acts as an antiresonantly reflective optical waveguide for the fundamental mode 13; the thickness of 0.5 μm of the reflection layers 3 and 7 is equal to approximately three-quarters of the wavelength of the laser light projected into the waveguide core 11. The radiation loss of the fundamental mode 13 is approximately 1/cm.

Figure 4:
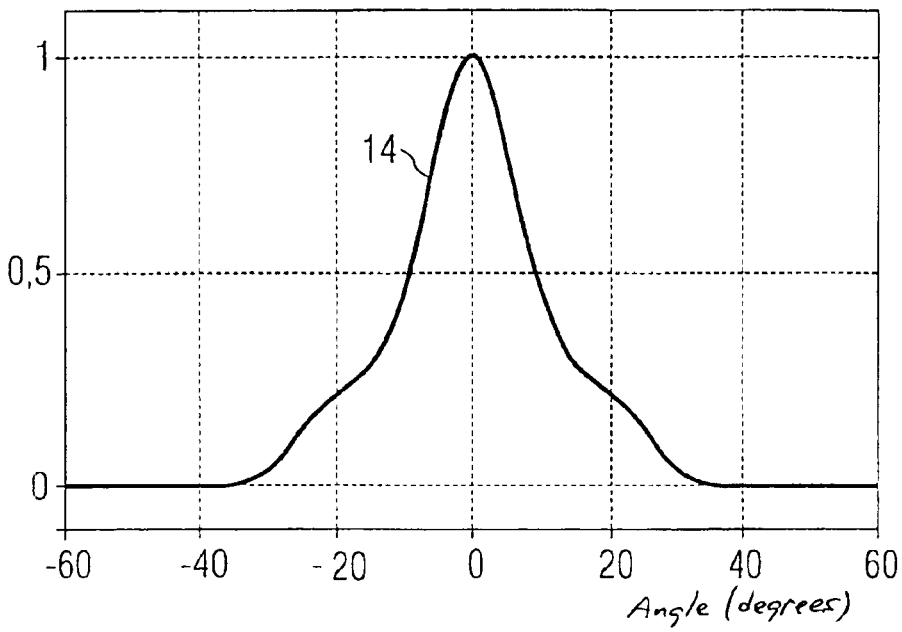
FIG. 4, a schematic illustration of a graph showing the course of the far-field intensity of the laser beam emitted by the semiconductor laser.

In FIG. 4, the calculated course of the far-field intensity 14 of the fundamental mode 13 is shown. The graph in FIG. 4 therefore shows the intensity distribution of the laser beam as a function of the vertical angle. The full width at half-maximum of the laser beam is 18.6°. Thus the vertical beam divergence is now only about half the vertical beam divergence of conventional semiconductor lasers.

Figure 5:
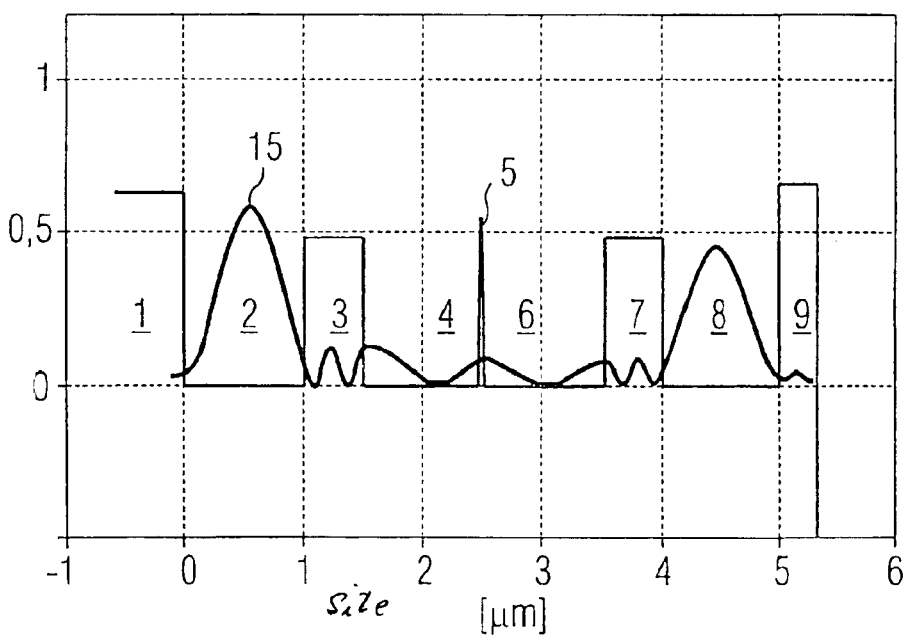
FIG. 5, a schematic illustration of a graph showing the course of the optical intensity of a higher-order mode superimposed on the course of the index of refraction.

FIG. 5 shows the calculated course of the optical intensity of a higher-order mode 15, superimposed on the index of refraction profile 12 in the illustration. As can be seen from the maximum intensities in the outer waveguide layers 2 and 8, the higher-order mode 15 is not reflected antiresonantly at the reflection layers 3 and 7. As a result of extending the higher-order mode 15 into the substrate 1 and the contact layer 9, the higher-order mode 15 involves higher losses, in comparison with the fundamental mode 13. The radiation losses of this higher-order mode 15 are 600/cm.

Figure 6:
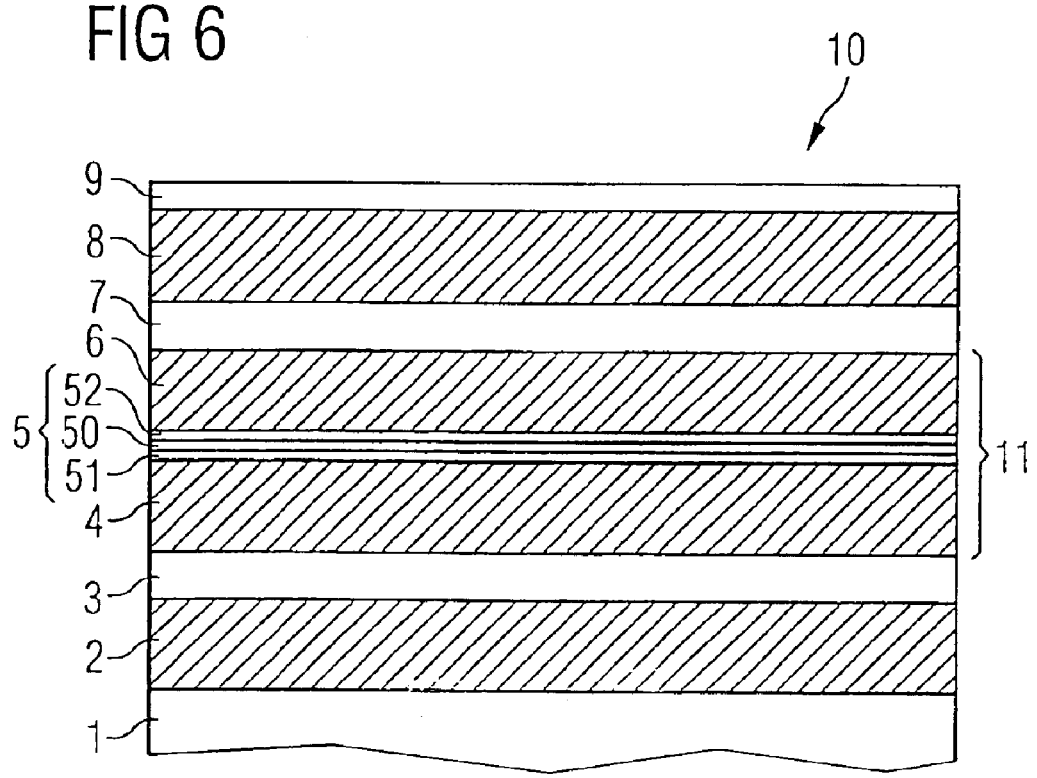
FIG. 6, a schematic illustration of a cross section through a further layer sequence of a semiconductor laser of the invention.

In another embodiment (FIG. 6), the active layer 5 includes two so-called spacer layers 51 and 52, between which an active quantum well 50 is disposed. An example of a layer sequence of such an embodiment is given in the following table:

| Type of Layer | Composition | Layer Thickness |
| --- | --- | --- |
| Contact layer | p-GaAs | 300 nm |
| Outer waveguide layer | p-$Al_{0.53}Ga_{0.47}As$ | 500 nm |
| Reflection layer | p-$Al_{0.15}Ga_{0.85}As$ | 500 nm |
| Inner waveguide layer | p-$Al_{0.53}Ga_{0.47}As$ | 1500 nm |
| Spacer layer | $Al_{0.30}Ga_{0.70}As$ -> $Al_{0.53}Ga_{0.47}As$ | 10 nm |
| Active quantum well | $GaAs_{0.83}P_{0.17}$ | 17 nm |
| Spacer layer | $Al_{0.30}Ga_{0.70}As$ -> $Al_{0.53}Ga_{0.47}As$ | 10 nm |
| Inner waveguide layer | p-$Al_{0.53}Ga_{0.47}As$ | 1500 nm |
| Reflection layer | p-$Al_{0.15}Ga_{0.85}As$ | 500 nm |
| Outer waveguide layer | p-$Al_{0.53}Ga_{0.47}As$ | 500 nm |
| Substrate | n-GaAs | |

Especially preferably, the reflection layers 3, 7 of the arrangements of the invention shown above are highly doped (such as $2 \times 10^{18}$ cm$^{-3}$). This provision is already the foundation of an inventive step on its own. By itself, regardless of the other structural provisions of the invention, it leads to improved power data of a semiconductor laser.

To reduce the bulk resistance, the heterojunctions of the above structures of the inventions can be graded.

In the present exemplary embodiments, the active layer 5 comprises a tension strained GaAsP quantum film, which emits transverse magnetically polarized light. The active layer 5 can in general comprise one or more quantum films of the composition XY, where X stands for at least one element from the group comprising the elements Al, In, and Ga, and Y stands for at least one element from the group comprising the elements As, P, N, and Sb. The active layer 5 can also be either free of strain or compression strained, which leads to the emission of transverse electrically polarized light, or tension strained, which brings about the emission of transverse magnetically polarized light. Moreover, the active layer 5 can be embedded in barrier layers of the aforementioned material XY. Instead of quantum films, quantum wires or quantum dots can be embedded in the barrier layers.

It should also be noted that the exemplary embodiments can be structured arbitrarily in the lateral direction and along the direction of propagation of the light in the semiconductor laser. Accordingly, the antiresonant waveguide 10 achieved by the aforementioned layer sequence can be used in broad stripe-geometry lasers, ridge geometry waveguide lasers, lasers with buried lateral waveguide structures, and distributed feedback lasers (or distributed bragg reflectors). The low beam divergence in the vertical direction and the large beam cross section at the site of the crystal facets are always an advantage.

It is understood that the explanation of the invention in terms of the exemplary embodiments is not to be understood as a limitation of the invention to them. The invention pertains in particular also to suitable material systems other than those named above. Moreover, besides the explicitly described semiconductor layers, still other supplementary semiconductor layers may be present in the structures.

What is claimed is:

1. A semiconductor laser, comprising:
a substrate; and
a layer sequence applied on the substrate to form an antiresonantly reflective waveguide in a vertical direction, said layer sequence including, in succession viewed from said substrate, a first outer waveguide layer, a first reflection layer, a waveguide core having a photo-emitting active layer, a second reflection layer, and a second outer waveguide layer;
wherein the first and second reflection layers have indexes of refraction which are greater than the indexes of refraction of the waveguide core and a respective adjacent outer waveguide layer.

2. The semiconductor laser of claim 1, wherein the waveguide core is bounded on opposite sides by the two reflection layers.

3. The semiconductor laser of claim 1, wherein the first and second outer waveguide layers each adjoin a next closest one of the two reflection layers.

4. The semiconductor laser of claim 1, wherein a thickness of the photo-emitting active layer is less than the thickness of adjoining layers of the waveguide core.

5. The semiconductor laser of claim 1, wherein a thickness of the first and second reflection layers is equal to an odd-numbered multiple of one-quarter of a wavelength of photons projected into the waveguide core.

6. The semiconductor laser of claim 1, wherein the layer sequence is symmetrical in its thickness relative to the photo-emitting active layer.

7. The semiconductor laser of claim 6, wherein a thickness of the photo-emitting active layer is between 0.01 and 0.03 μm, a thickness of the waveguide core is between 1.5 and 2.5 μm, thicknesses of the first and second reflection layers are between 0.4 and 0.6 μm, and thicknesses of the outer waveguide layers are between 0.5 and 1.5 μm.

8. The semiconductor laser of claim 1, wherein an index of refraction of the substrate is greater than an index of refraction of an adjacent outer waveguide layer and the waveguide core.

9. The semiconductor laser of claim 1, wherein a contact layer having an index of refraction, which is greater than an index of refraction of the adjacent outer waveguide layer and greater than an index of refraction of the waveguide core, is applied to the layer sequence.

10. The semiconductor laser of claim 1, wherein an index of refraction of the outer waveguide layers is equal to an index of refraction of the waveguide core.

11. The semiconductor laser of claim 9, wherein an index of refraction of the substrate and of the contact layer is equal to an index of refraction of each of the adjacent reflection layers.

12. The semiconductor laser of claim 1, wherein the layer sequence is symmetrical with respect to indexes of refraction relative to the active layer.

13. The semiconductor laser of claim 1, wherein the substrate and the layer sequence between the substrate and the photo-emitting active layer are n-conducting.

14. The semiconductor laser of claim 1, wherein a contact layer and the layer sequence between the photo-emitting active layer and the contact layer are p-conducting.

15. The semiconductor laser of claim 1, wherein the substrate and a contact layer are produced from GaAs.

16. The semiconductor laser of claim 15, wherein the layer sequence is produced from a semiconductor containing Al, Ga, and As.

17. The semiconductor laser of claim 15, wherein the reflection layers are produced from a semiconductor containing Al, Ga, and As, and the waveguide core and the outer waveguide layers are produced from a semiconductor containing In, Ga and P.

18. The semiconductor laser of claim 1, wherein the photo-emitting active layer has at least one quantum film embedded in barrier layers.

19. The semiconductor laser of claim 1, wherein the photo-emitting active layer has at least one quantum wire embedded in barrier layers.

20. The semiconductor laser of claim 1, wherein the photo-emitting active layer has quantum dots embedded in barrier layers.

21. The semiconductor laser of claim 1, wherein the photo-emitting active layer is identical to the waveguide core.

22. The semiconductor laser of claim 1, wherein the photo-emitting active layer has two spacer layers, between which at least one quantum well is disposed.

23. The semiconductor laser of claim 22, wherein the spacer layers each have an increasing Al content from a quantum well to following waveguide layers.

24. The semiconductor laser of claim 1, wherein the reflection layers are highly doped.

25. The semiconductor laser of claim 24, wherein a dopant concentration in the reflection layers is between $5 \times 10^{17}$ and $5 \times 10^{19}$ cm$^{-3}$.

* * * * *